United States Patent
Komatsu

(10) Patent No.: US 6,273,812 B1
(45) Date of Patent: Aug. 14, 2001

(54) HERMETIC TYPE OUTDOOR EQUIPMENT PROVIDED WITH RESPIRATORY STRUCTURE

(75) Inventor: Kazuo Komatsu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/387,723

(22) Filed: Sep. 1, 1999

(30) Foreign Application Priority Data

Sep. 8, 1998 (JP) .................................................. 10-254328

(51) Int. Cl.[7] ...................................................... H05K 5/00
(52) U.S. Cl. ............................................ 454/184; 55/385.6
(58) Field of Search .......................... 454/184; 55/385.4, 55/385.6, 385.7; 174/50, 17 VA, 15.1

(56) References Cited

U.S. PATENT DOCUMENTS 4,981,805 * 1/1991 Yazawa et al. ...................... 436/169

FOREIGN PATENT DOCUMENTS 9-13609   1/1997 (JP) .

* cited by examiner

*Primary Examiner*—Jiping Lu
(74) *Attorney, Agent, or Firm*—Young & Thompson

(57) ABSTRACT

A hermetic type outdoor equipment such as radio relay equipment is provided with a respiratory structure (8) having a minute-hole sheet (5) applied to a respiratory hole (4) of a case (3) of the equipment, and capillary members (9) implanted outwardly on a surface of the minute-hole sheet (5). The equipment case (3) is composed of a lower housing (2) and an upper housing (1) hermetically engaged with the lower housing (2), and the respiratory hole (4) is formed through the lower housing (2). The minute-hole sheet (5) is disposed at the inner surface side of the case (3), and the capillary members (9) extend outwardly within the respiratory hole (4). A plate (6) having an opening (6a) at a position corresponding to the respiratory hole (4) and superimposed to the minute-hole sheet (5) and the minute-hole sheet (5) is fixed to the lower housing (2) of the case (3) by screws (7).

8 Claims, 4 Drawing Sheets

HERMETIC TYPE OUTDOOR EQUIPMENT PROVIDED WITH RESPIRATORY STRUCTURE

BACKGROUND OF THE INVENTION

1. Field of the Invention

The present invention relates to a hermetic type outdoor equipment provided with a respiratory structure capable of preventing invasion of rain water, dust, etc. into the equipment via a respiratory hole formed through a hermetic case to ensure entrance and exit of air. The present invention is applicable to a hermetic type equipment provided with the respiratory structure such as radio relay equipment which is disposed outdoors.

2. Description of the Related Art

In such a hermetic type outdoor equipment, the air in a case of the equipment is warmed by a thermal effect of solar radiation, and the inner pressure may be increased due to the difference between the temperature of the inner air and the temperature of the outside air. In order to avoid the increase of pressure in the case and to radiate the inner heat to the outside, a structure for respiration (respiratory structure) for exit of the air in the case to the outside and for entrance of the outside air into the case is required. Accordingly, it is a general method that a respiratory hole is formed at a bottom portion of the case or the like at which invasion of rain water can be avoided, and a mesh member or a minute-hole sheet is mounted on the respiratory hole to keep a desired respiratory action.

For example, as shown in FIG. 1, a respiratory hole 14 is formed in the bottom protion of a case 13 in which a device, not shown, is accommodated. A minute-hole sheet 15 made of synthetic resin is arranged in the case 13 at a position correspnding to the respiratory hole 14. A plate 16 having an opening 16a at a position corresponding to the respiratory hole 14 is superimposed to the minute-hole sheet 15. The plate 16 and minute-hole sheet 15 are fixed to the case 13 by means of screws 17.

As shown in FIG. 2, minute-holes 15a are formed in the entire region of the minute-hole sheet 15, and a central area 15b of the minute-hole sheet 15 is exposed to the outside via the respiratory hole 14.

Bird lice, etc. inhabiting the environment around the hermetic type outdoor equipment provided with the respiratory structure have such a behavior (thermal attraction) that they gather in the neighborhood of the respiratory hole 14 in response to specific temperature range atmosphere, particularly in a temperature range atmosphere which is generated by the exit of the heated inner air to the outside via the respiratory hole 14 due to their growth instinct, and thus the minute-hole sheet 15 is bit ten and broken by the bird lice gathering at the respiratory hole 14, so that the bird lice are allowed to invade into the case 13 and thus cause the failure of the device.

SUMMARY OF THE INVENTION

The present invention has been implemented in view of the foregoing situation, and has an object to provide a hermetic type outdoor equipment provided with a respiratory structure which is improved so that the equipment can be prevented from being damaged by bird lice, etc. with keeping waterproof and dustproof properties.

In order to attain the above object, there is provided a hermetic type outdoor equipment provided with a respiratory structure, the respiratory structure comprising a minute-hole sheet applied to a respiratory hole of a case of the equipment, the minute-hole sheet being air-permeable and water-impermeable, and capillary members implanted outwardly on the minute-hole sheet.

The minute-hole sheet may be disposed at the inner surface side of the case, and the capillary members extend outwardly within the respiratory hole. The respiratory structure may further comprise a plate having an opening at a position corresponding to the respiratory hole and superimposed to the minute-hole sheet, and means for fixing the plate and the minute-hole sheet to the case.

According to the present invention, the tip ends of the capillary members function to effectively hinder the bird lice, etc. from moving toward the minute-hole sheet, so that the bird lice, etc. are prevented from biting and breaking the minute-hole sheet. Therefore, even when bird lice, etc. are about to invade into the equipment via the respiratory hole, they are prevented from invading into the case of the equipment by the capillary members, and an electrical failure can be prevented from occurring due to the invasion of bird lice, etc. in the equipment.

DETAILED DESCRIPTION OF THE PREFERRED EMBODIMENT

A preferred embodiment according to the present invention will be described with reference to the accompanying drawings.

Figure 1:
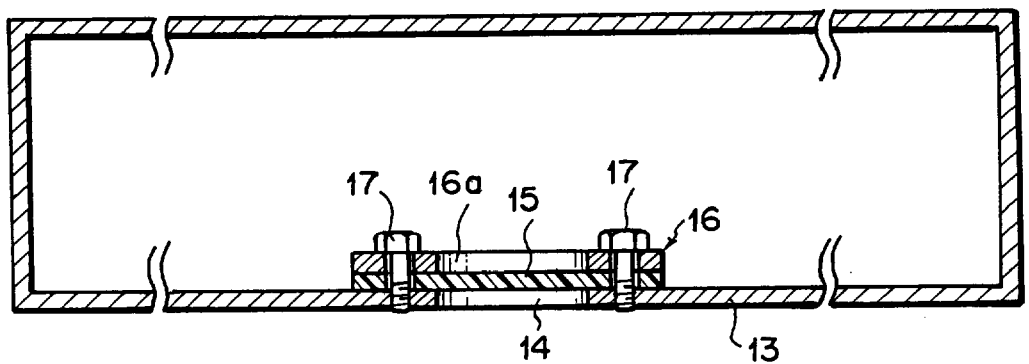
FIG. 1 is a cross-sectional view of the conventional respiratory structure of a hermetic type outdoor equipment.
Figure 2:
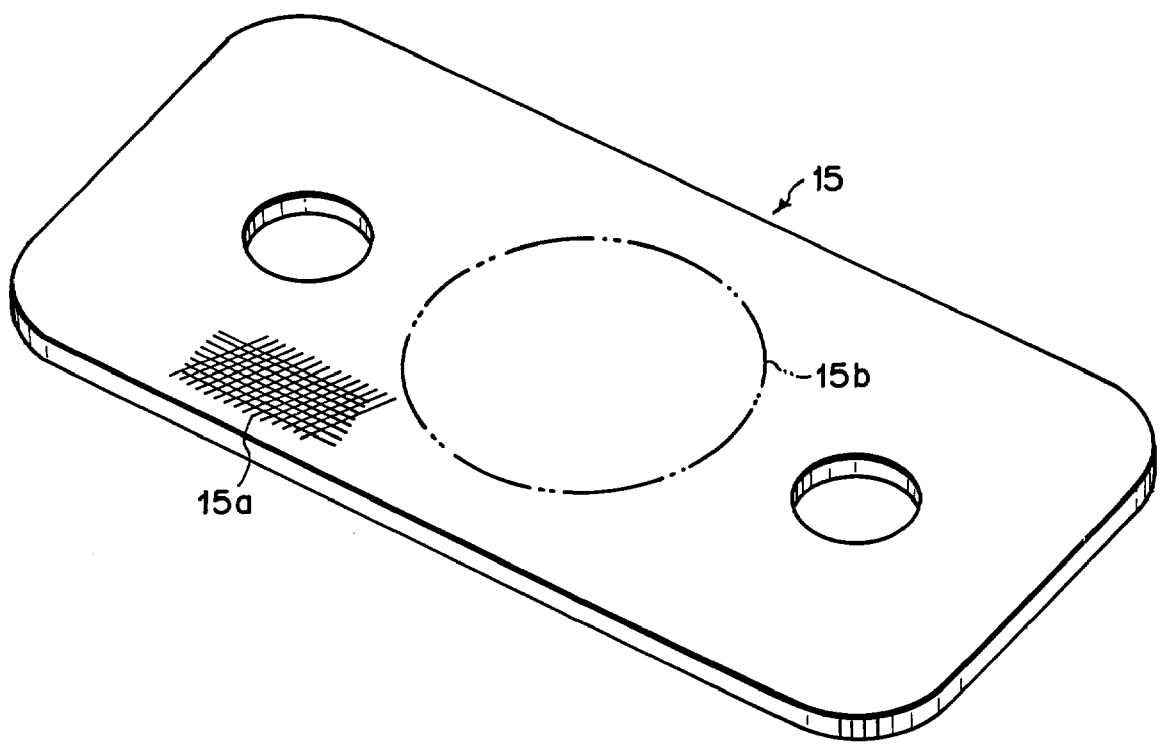
FIG. 2 is a perspective view of a minute-hole sheet used in the respiratory structure of FIG. 1.
Figure 3:
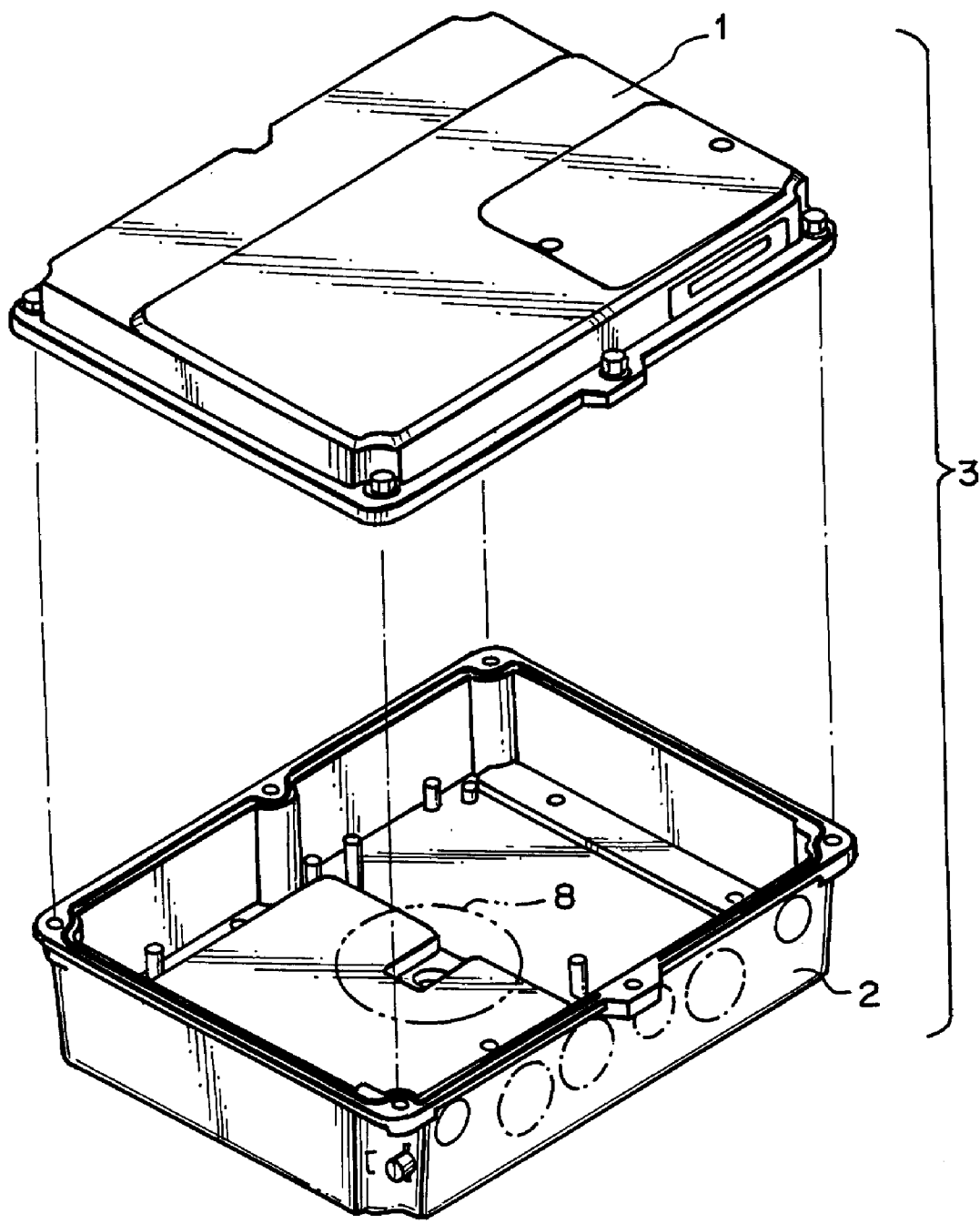
FIG. 3 is an exploded perspective view of a case according to an embodiment of the present invention.

In one embodiment of a hermetic type outdoor equipment according to the present invention, as shown in FIG. 3, a case 3 of the equipment is composed of an upper housing 1 and a lower housing 2, that is, the upper housing 1 and the lower housing 2 are hermetically or liquid-tightly engaged with each other to form the equipment case 3. In the equipment case 3, there is an electronic device for radio relaying, not shown, for example.

Figure 4:
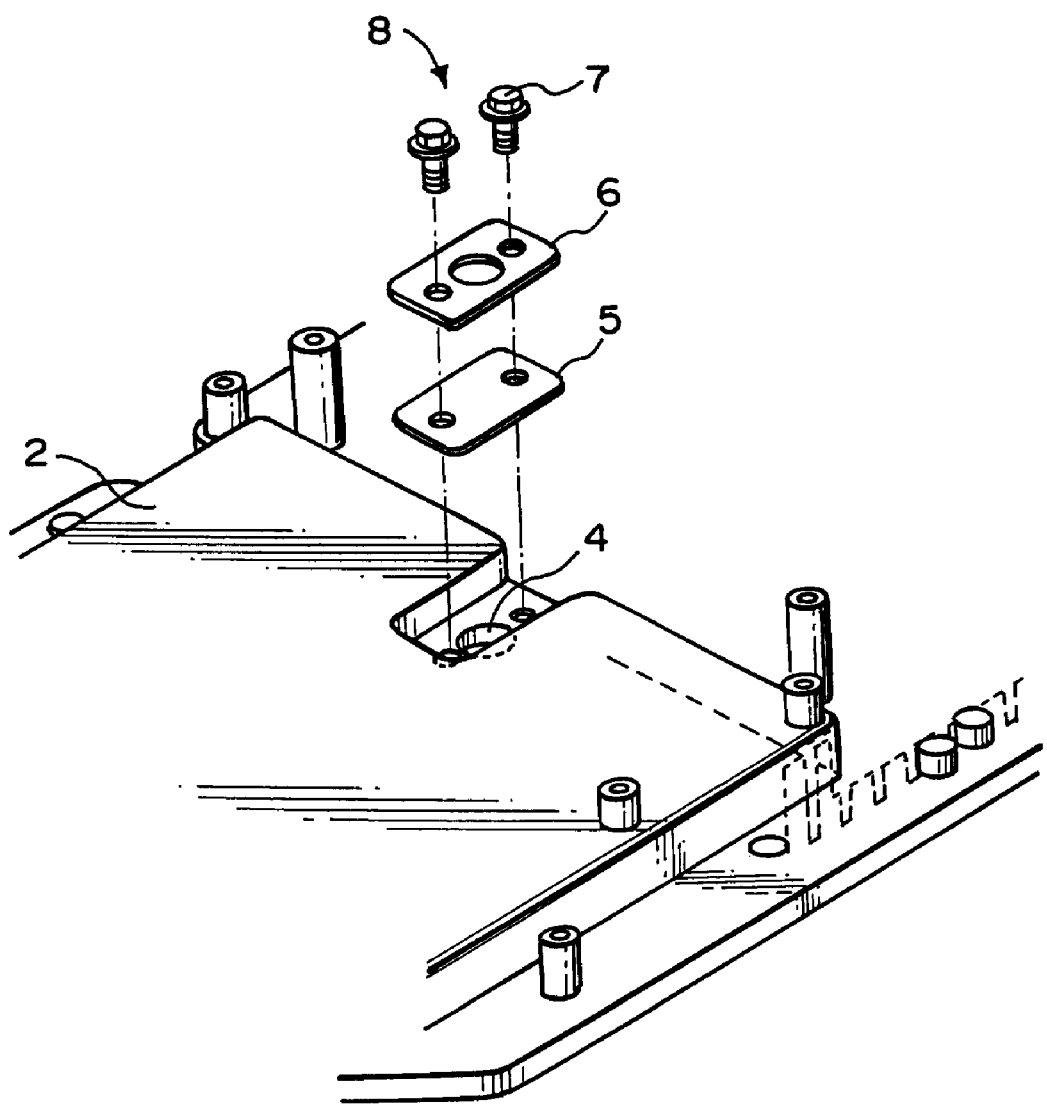
FIG. 4 is an exploded perspective view of a respiratory structure formed on the case of FIG. 3.
Figure 5:
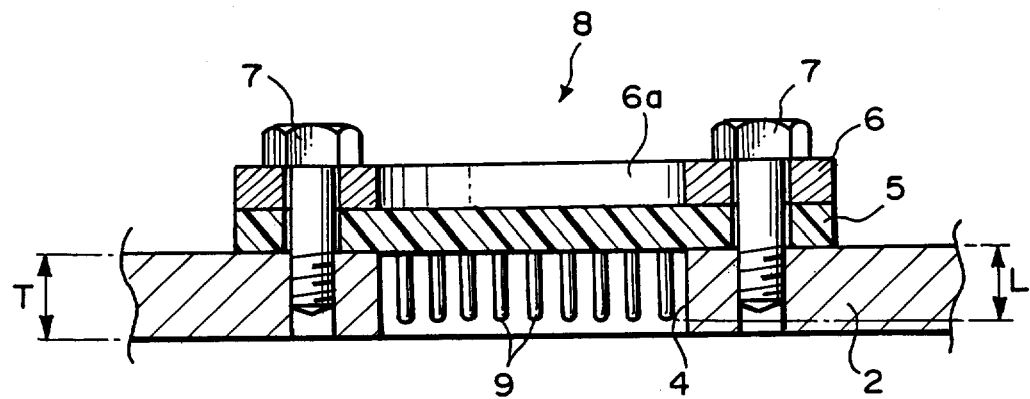
FIG. 5 is a cross-sectional view of the respiratory structure of FIG. 4.

The lower housing 2 is provided with a respiratory structure 8. As shown in FIGS. 4 and 5, the respiratory structure 8 has a respiratory hole 4 formed through a bottom portion of the lower housing 2, a minute-hole sheet (which may be a mesh member such as non-woven fabric) 5 disposed at the inside of the case so as to cover the respiratory hole 4, a plate 6 having an opening 6a at a position corresponding to the respiratory hole 4 and superimposed to the minute-hole sheet 5, screws 7 for fixing the plate 6 and the minute-hole sheet 5 to the lower housing 2, and a plurality of capillary members 9 implanted on a surface of the minute-hole sheet 5. The inner diameter of the respiratory hole 4 is greater than 10 mm and smaller than 12 mm, for example. The thickness of the minute-hole sheet 5 is greater than 0.5 mm and smaller than 1.0 mm, for example.

Figure 6:
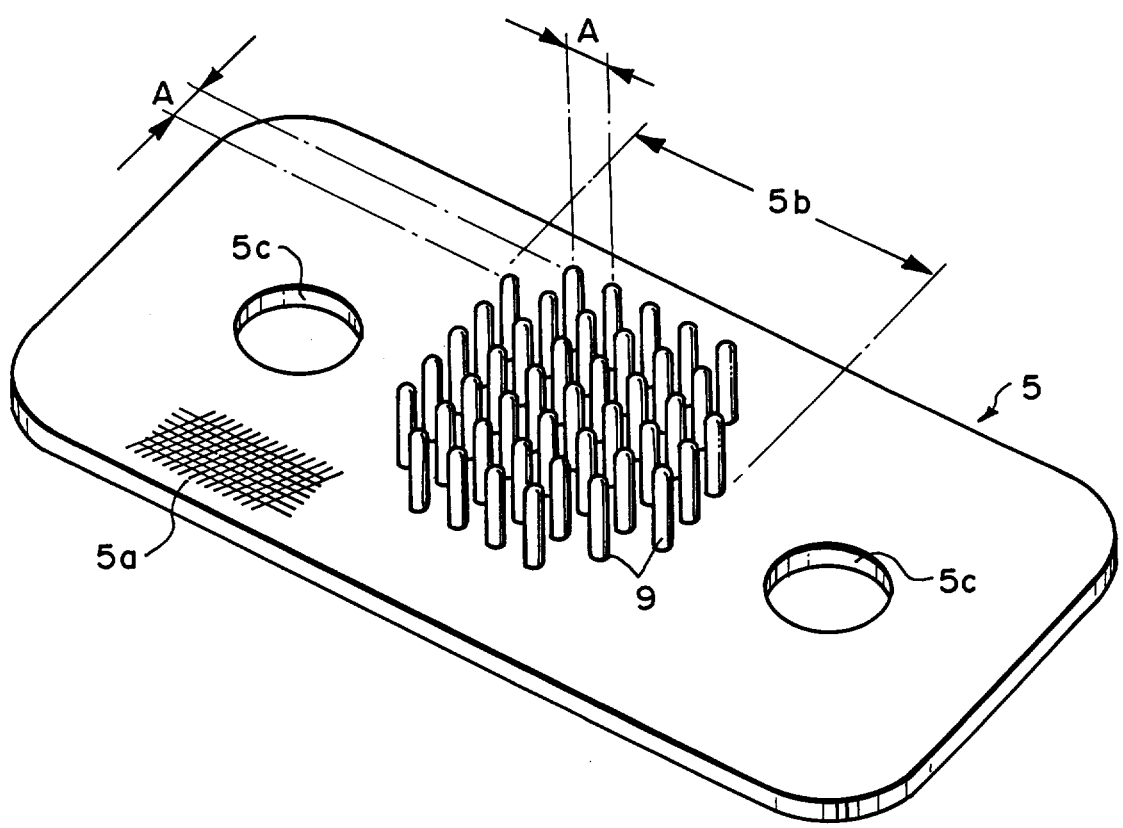
FIG. 6 is a perspective view of a minute-hole sheet used in the respiratory structure of FIG. 4.

As shown in FIG. 6, the minute-hole sheet 5 has numerous minute-holes 5a over the entire region of the minute-hole sheet 5. Each of the minute-holes 5a has gas permeability and no water permeability. The inner diameter of the minute-holes 5a is greater than 1 μm and smaller than 10 μm, for example. The minute-hole sheet 5 may be made of synthetic resin such as polytetrafluoroethylene, and preferably has a water repellency and excellent weathering resistance.

The capillary members 9 are implanted on the minute-hole sheet 5 at the central area 5b thereof corresponding to the respiratory hole 4. The capillary members 9 can be fixed to one surface of the minute-hole sheet 5 of synthetic resin by static flocking process for example. The interval or pitch (A) of arrangement of the capillary members 9 is not necessarily restricted to a fixed value over the entire region, however, preferably smaller than the size of bird lice, etc. inhabiting the environment around the equipment. The pitch (A) is greater than 0.3 mm and smaller than 0.5 mm, for example.

As shown in FIG. 5, the tip end of the capillary members 9 having the length (L) is preferably positioned at a level higher (inner) than that of the lower surface (outer surface) of the lower housing 2, however, is not restricted to this. As shown in FIG. 5, in connection to the thickness (T) of the lower housing 2, it is preferable to satisfy the relationship L<T in order to reduce possibility of contact of the tip end or lower end of the capillary members 9 to any member located outside the lower housing 2. However, the relationship L≧T may be satisfied if the possibility of contact of the tip end or lower end of the capillary members 9 to any member located outside the lower housing 2 is low. Furthermore, it is preferable to satisfy the relationship L≧A in order to significantly reduce accessibility of the bird lice to the minute-hole sheet 5. The length (L) is greater than 1.0 mm and smaller than 2.0 mm, for example, and the diameter of the capillary member 9 is greater than 1 μm and smaller than 10 μm, for example.

The capillary members 9 are preferably formed of materials which are firm and have high breaking force, e.g. metal fiber such as stainless steel fiber, copper fiber, etc.

As shown in FIG. 6, the minute-hole sheet 5 is provided with two openings 5c for allowing the screw 7 to pass through. As shown in FIG. 5, the plate 6 is provided with an opening 6a at the position corresponding to the respiratory hole 4 and with two openings at the position corresponding to the openings 5c of the minute-hole sheet 5 for allowing the screws 7 to pass through. The screws 7 are engaged with female threads formed in the lower housing 2.

According to the above embodiment of the present invention, since a plurality of capillary members 9 planted on the lower surface of the minute-hole sheet 5 extend downward or outwardly in the respiratory hole 4, the tip ends of the capillary members 9 function to effectively hinder the bird lice from moving toward the minute-hole sheet 5, so that the bird lice can be prevented from biting and breaking the minute-hole sheet and thus invading into the case 3. Therefore, even when bird lice are about to invade into the equipment via the respiratory hole 4, they are prevented from invading into the case 3 of the equipment by the capillary members 9, and an electrical failure can be prevented from occurring due to the invasion of bird lice in the equipment.

What is claimed is:

1. A hermetic type outdoor equipment provided with a respiratory structure, said respiratory structure comprising:

a minute-hole sheet applied to a respiratory hole of a case of the equipment, said minute-hole sheet being air-permeable and water-impermeable; and capillary members implanted outwardly on said minute-hole sheet.

2. The hermetic type outdoor equipment as claimed in claim 1, wherein said minute-hole sheet is disposed at the inner surface side of said case, and said capillary members extend outwardly within said respiratory hole.

3. The hermetic type outdoor equipment as claimed in claim 2, wherein said respiratory structure further comprises a plate having an opening at a position corresponding to said respiratory hole and superimposed to said minute-hole sheet; and means for fixing said plate and said minute-hole sheet to said case.

4. The hermetic type outdoor equipment as claimed in claim 1, wherein said case comprises a lower housing and an upper housing which is hermetically engaged with said lower housing, and said respiratory hole is formed through said lower housing.

5. The hermetic type outdoor equipment as claimed in claim 1, wherein tip ends of said capillary members are positioned at a level recessed from the outer surface of said case.

6. The hermetic type outdoor equipment as claimed in claim 1, wherein the length of each of said capillary members is greater than a pitch of arrangement of said capillary members.

7. The hermetic type outdoor equipment as claimed in claim 1, wherein said capillary members are made of metal.

8. The hermetic type outdoor equipment as claimed in claim 1, wherein said minute-hole sheet is made of synthetic resin.

* * * * *